US009356050B2

United States Patent
Cha et al.

(10) Patent No.: US 9,356,050 B2
(45) Date of Patent: May 31, 2016

(54) DISPLAY APPARATUS AND METHOD OF MANUFACTURING THE SAME

(71) Applicant: Samsung Display Co., Ltd., Yongin, Gyeonggi-Do (KR)

(72) Inventors: Tae-Woon Cha, Yongin (KR); Woo-Yong Sung, Yongin (KR); Tae-Gyun Kim, Yongin (KR); Hyoung-Sub Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 66 days.

(21) Appl. No.: 14/308,009

(22) Filed: Jun. 18, 2014

(65) Prior Publication Data
US 2015/0192806 A1  Jul. 9, 2015

(30) Foreign Application Priority Data

Jan. 8, 2014 (KR) ........................ 10-2014-0002491

(51) Int. Cl.
*G02F 1/1341* (2006.01)
*H01L 27/12* (2006.01)
(Continued)

(52) U.S. Cl.
CPC ........ *H01L 27/124* (2013.01); *G02F 1/133377* (2013.01); *G02F 1/1341* (2013.01);
(Continued)

(58) Field of Classification Search
CPC ............ H01L 29/7869; H01L 29/4908; H01L 29/0669; H01L 29/413; H01L 29/41733; H01L 29/51; H01L 29/66765; H01L 29/786; H01L 29/78603; H01L 29/78633; H01L 29/78669; H01L 29/78678; H01L 27/1214; H01L 27/3262; H01L 27/3276; H01L 27/3244; H01L 27/1248; H01L 27/1251; H01L 27/3211; H01L 27/3246; H01L 31/022466; H01L 51/102; H01L 51/5253; H01L 51/0048; H01L 51/4273; H01L 51/448; H01L 51/001; H01L 2251/5369; H01L 22/10; H01L 21/02107; H01L 21/02603; G02F 1/133377; G02F 1/1341; G02F 1/136227; G02F 1/1368; G02F 1/13439; G02F 1/133345; G02F 1/1339; G02F 1/1334; G02F 1/133512; G02F 1/1362; G02F 1/133305; G02F 1/133514; G02F 1/1337; G02F 1/1343; G02F 1/134309; G02F 1/136209; G02F 1/136286; G02F 1/134336; G02F 1/13; G02F 1/136; G02F 2001/136222; G02F 2001/133519; G02F 2202/02; G02F 2202/10; B82Y 10/00; B82Y 20/00; B82Y 30/00; H05K 2201/0108; H05K 2201/026; H05K 2201/0257; H05K 3/249; H05K 1/095; G09G 2300/0417; G09G 2300/0439; B32B 15/08; B32B 2255/10; B32B 2307/412; B32B 2457/202; B32B 27/08; B32B 7/12
USPC ...... 257/43, 59, E27.111, E21.414, 257/E29.273, E21.409, E29.117, E29.151, 257/E21.585, E29.291, E31.124, E31.126; 438/30, 158, 151, 149, 70, 118, 608, 438/637; 349/43, 86, 138, 123, 139, 42, 89, 349/110, 143, 92, 153, 106, 187; 345/205, 345/87; 445/25; 977/888, 762, 948, 952
See application file for complete search history.

(56) References Cited

U.S. PATENT DOCUMENTS 5,949,508 A * 9/1999 Kumar .................. G02F 1/1334
349/122

(Continued)

FOREIGN PATENT DOCUMENTS

JP 2001-142086 5/2001
JP 2008-129327 6/2008

(Continued)

*Primary Examiner* — Thoi Duong
(74) *Attorney, Agent, or Firm* — Innovation Counsel LLP

(57) ABSTRACT

A display apparatus includes a substrate; a cavity layer; a display material layer; and a capping layer. The cavity layer includes a plurality of barriers arranged to be spaced apart from one another on the substrate and partitioning pixel regions, and a roof layer connecting upper parts of the plurality of barriers. The cavity layer forms a plurality of cavities including a cavity. The display material layer is formed in the cavity. The capping layer is formed on the cavity layer, the capping layer including a sealant and a plurality of fillers dispersed in the sealant.

20 Claims, 14 Drawing Sheets

(51) Int. Cl.
*G02F 1/1333* (2006.01)
*H01L 51/56* (2006.01)
*H01L 51/52* (2006.01)

(52) U.S. Cl.
CPC ......... *G02F2202/36* (2013.01); *H01L 51/5253* (2013.01); *H01L 51/56* (2013.01); *H01L 2227/323* (2013.01); *H01L 2251/5369* (2013.01)

(56) References Cited

U.S. PATENT DOCUMENTS

| | | | |
|---|---|---|---|
| 5,986,729 A * | 11/1999 | Yamanaka | G02F 1/1333 349/153 |
| 6,141,072 A | 10/2000 | Drabik et al. | |
| 6,777,871 B2 * | 8/2004 | Duggal | B82Y 20/00 313/504 |
| 7,932,984 B2 | 4/2011 | Lee et al. | |
| 8,269,214 B2 * | 9/2012 | Smigelski, Jr. | H01L 51/5268 257/40 |
| 2012/0008191 A1 * | 1/2012 | Lim | G02F 1/167 359/296 |
| 2012/0062448 A1 * | 3/2012 | Kim | G02F 1/133377 345/55 |

FOREIGN PATENT DOCUMENTS

| | | |
|---|---|---|
| JP | 2008-129331 | 6/2008 |
| JP | 2009-098306 | 5/2009 |
| KR | 1020090073466 A | 7/2009 |

* cited by examiner

DISPLAY APPARATUS AND METHOD OF MANUFACTURING THE SAME

RELATED APPLICATIONS

This application claims the benefit of Korean Patent Application No. 10-2014-0002491, filed on Jan. 8, 2014, in the Korean Intellectual Property Office, the disclosure of which is incorporated herein in its entirety by reference.

BACKGROUND

1. Field

One or more embodiments of the present application relate to a display apparatus and a method of manufacturing the same.

2. Description of the Related Art

As flat panel display apparatuses, liquid crystal displays (LCDs) and organic light-emitting displays (OLEDs) are being widely used. The display apparatuses generally include pixel electrodes, display material layers, and common electrodes, and may have structures in which the display material layers are arranged between the substrates on which the pixel electrodes are formed, and substrates on which the common electrodes are formed.

For example, the LCDs include lower substrates on which the pixel electrodes are formed, upper substrates on which the common electrodes are formed, and liquid crystal layers that are inserted between the lower substrates and the upper substrates.

When voltages are applied to between the pixel electrodes and the common electrodes, electric fields are formed on the liquid crystal layers. The formed electric fields change the arrangements of liquid crystal molecules forming the liquid crystal layers, and incident layers passing through regions of liquid crystal layers in which the arrangements of liquid crystal molecules are different have different phase differences. Lights having different phase differences pass through a polarizer at different transmittance. Thus, since an amount of light passing through a polarizer changes when the magnitude of an electric field formed on the liquid crystal layer is adjusted, it is possible to display an image by using the change in light amount.

An LCD having a vertical alignment (VA) mode in which the long axis of a liquid crystal molecule is arranged perpendicularly to the substrates on and under the liquid crystal layer while an electric field is not formed on the liquid crystal layer has a good display quality because its contrast ratio is large. The VA mode is being developed as a patterned VA (PVA) mode, a micro-slit mode, or a super VA (SVA) mode to implement a wide viewing angle.

Information disclosed in this Background section was already known to the inventors of the inventive concept before achieving the inventive concept or is technical information acquired in the process of achieving the inventive concept. Therefore, it may contain information that does not form the prior art that is already known in this country to a person of ordinary skill in the art.

SUMMARY

One or more embodiments includes a display apparatus and a method of manufacturing the same.

Additional aspects will be set forth in part in the description which follows and, in part, will be apparent from the description, or may be learned by practice of the presented embodiments.

According to one or more embodiments, a display apparatus includes a substrate; a cavity layer; a display material layer; and a capping layer. The cavity layer includes a plurality of barriers arranged to be spaced apart from one another on the substrate and partitioning pixel regions, and a roof layer connecting upper parts of the plurality of barriers. The cavity layer forms a plurality of cavities including a cavity. The display material layer is formed in the cavity. The capping layer is formed on the cavity layer, the capping layer including a sealant and a plurality of fillers dispersed in the sealant.

The sealant may include an acryl-based or epoxy-based polymer material.

A viscosity of the sealant may be 30 CP to 10000 CP.

The fillers may include a nanoparticle, nanowire, or nanorod, which is nano-sized.

An aspect ratio of the fillers may be 50 or more.

A volume fraction of the fillers contained in the sealant may be 0.5% to 5%.

A material of the fillers may include Ta, Nb, Zr, Th, Ti, Al, Mg, Ba, P, or a getter material.

A common electrode and a pixel electrode that are formed of transparent electrode materials may be formed over and under the cavity respectively.

Between the substrate and the cavity layer, a transistor driving the pixel electrode and a passivation layer passivating the transistor may be formed.

Between the passivation layer and the cavity layer, a black matrix faces the barriers and a color filter faces the cavity.

The display material layer may include a liquid crystal layer or an organic emission layer.

According to one or more embodiments, a method of manufacturing a display apparatus includes: forming a cavity layer including a plurality of barriers arranged to be spaced apart from one another on a substrate and partitioning pixel regions, and a roof layer connecting upper parts of the plurality of barriers. The cavity layer forms a plurality of cavities. A display material layer is formed in the plurality of cavities. A capping layer is formed on the cavity layer, the capping layer being formed of a material formed by diffusing a plurality of fillers to a sealant.

The sealant may include an acryl-based or epoxy-based polymer material.

A viscosity of the sealant is 30 CP to 1000 CP.

The fillers may include a nanoparticle, nanowire, or nanorod, which is nano-sized.

An aspect ratio of the fillers may be 50 or more.

A volume fraction of the fillers contained in the sealant may be 1% to 5%.

A material of the fillers may include Ta, Nb, Zr, Th, Ti, Al, Mg, Ba, or P.

The forming of the cavity layer may include forming a sacrificial layer on the substrate, the sacrificial layer having a shape corresponding to the plurality of cavities; and forming an organic layer on the sacrificial layer and stripping the sacrificial layer.

The forming of the display material layer may include injecting liquid crystals into the plurality of cavities.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
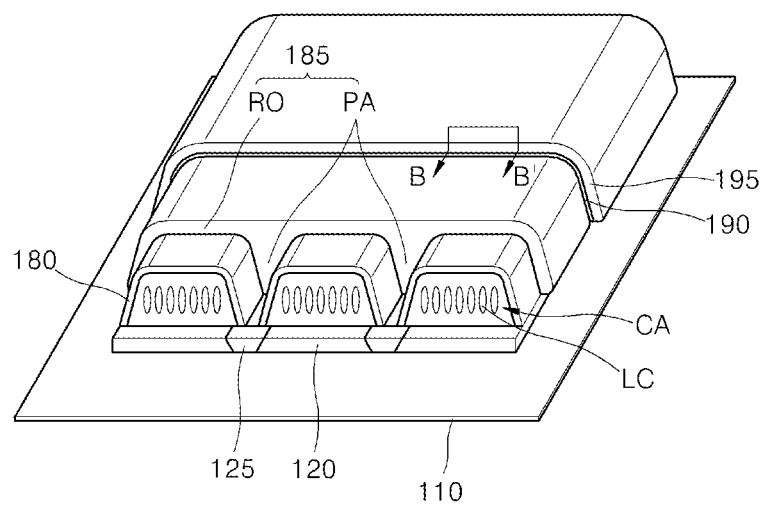
FIGS. 1A and 1B show schematic structures of a display apparatus according to an embodiment and are a partially-cut perspective view and a cross-sectional view respectively.

Since the inventive concept may make various modifications and have several embodiments, particular embodiments will be illustrated in the drawings and described in the detailed description in detail. The effects and features of the inventive concept, and implementation methods thereof will be clarified through the following embodiments described with reference to the accompanying drawings. The inventive concept may, however, be embodied in different forms and should not be construed as limited to the embodiments set forth herein.

Embodiments are described below in detail with reference to the accompanying drawings and when referring to the drawings, the same or similar components are denoted by the same reference numerals and are not repetitively described.

In the following embodiments, the terms a first, a second, etc. are not used as limited meanings but used for the purpose of distinguishing one component from another component.

In the following embodiments, the terms of a singular form may include plural forms unless referred to the contrary.

The meaning of "include", "has", "including", or "having" specifies a characteristic or component described herein but does not exclude one or more characteristics or components.

When a part of a layer, a region, or a component is referred to as being "on" another part, it can be directly on the other part or intervening layers, regions, or components may also be present.

In the drawings, the sizes of components may be exaggerated or reduced for the convenience of description. For example, since the size and thickness of each component represented in the drawings is represented for the convenience of description, the embodiments are not necessarily limited to those shown.

When some embodiments may be implemented by using other methods, the order of specific processes may be different from that described. For example, two processes that are successively described may be performed substantially simultaneously or in an order opposite to that described.

Expressions such as "at least one of," when preceding a list of elements, modify the entire list of elements and do not modify the individual elements of the list.

Figure 1B:
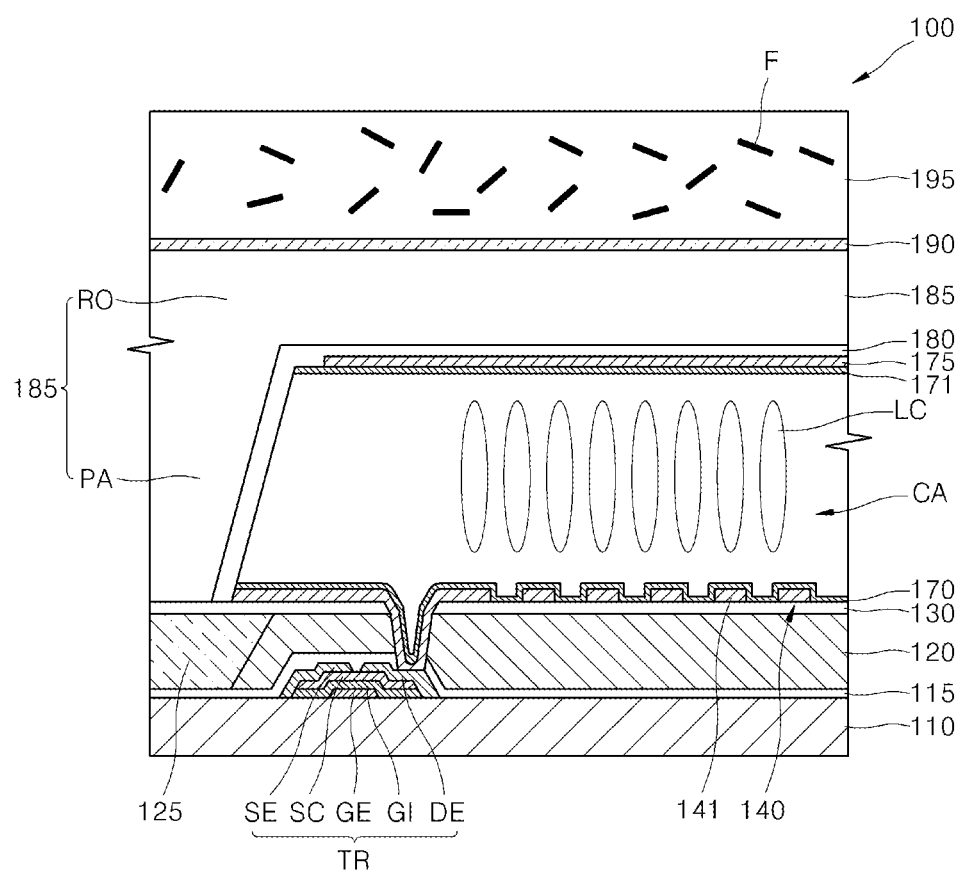
Figure 2:
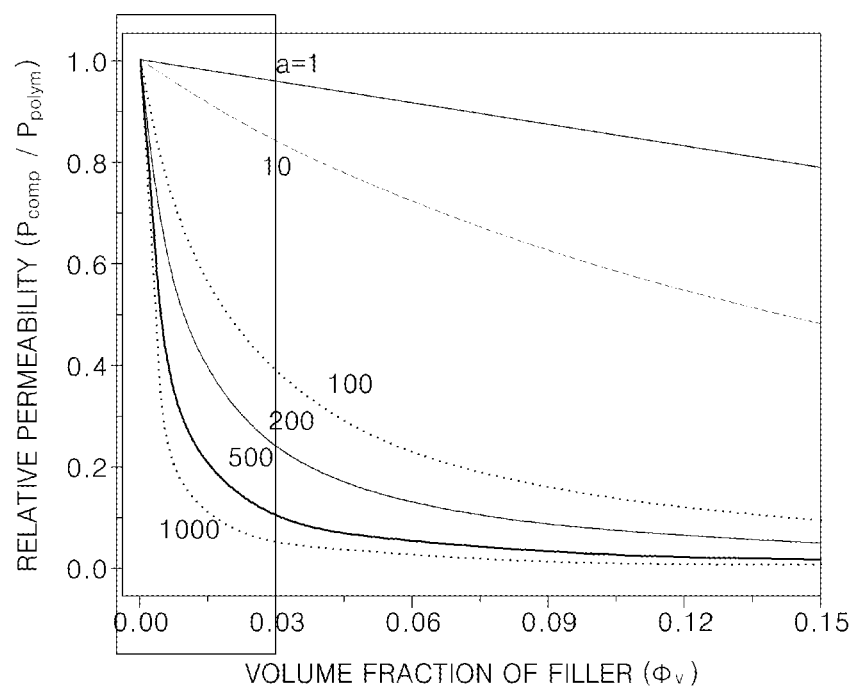
FIGS. 2 and 3 are graphs of permeability vs. volume fraction of a filler contained in a capping layer of the display apparatus of FIG. 1.
Figure 3:
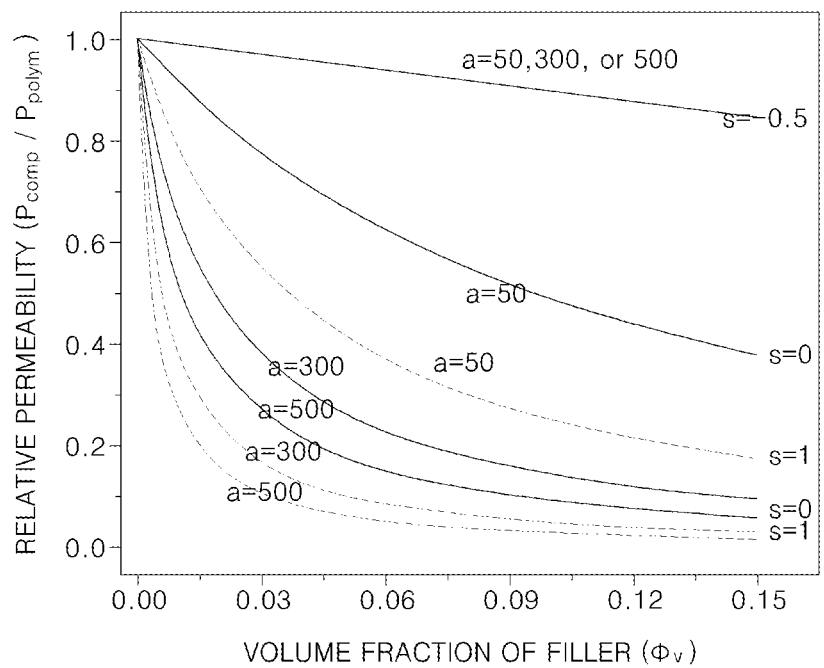

FIGS. 1A and 1B show schematic structures of a display apparatus according to an embodiment and are a partially-cut perspective view and a cross-sectional view taken along line B-B' of FIG. 1A, respectively. FIGS. 2 and 3 are graphs of permeability vs. volume fraction of a filler contained in a capping layer of the display apparatus of FIG. 1.

Referring to FIGS. 1A and 1B, a display apparatus 100 includes a substrate 110 and a cavity layer 185. The cavity layer 185 includes a plurality of barriers PA spaced apart from one another on the substrate 110 and a plurality of roof layers RO connecting the upper parts of the plurality of barriers PA and forms a plurality of cavities CA. A capping layer 195 is formed on the cavity layer 185 and formed of a material formed by diffusing a plurality of fillers to a sealant.

Since such a structure is an embedded microcavity structure, it has advantages in costs and weight in comparison to a typical structure, such as a structure in which a liquid crystal layer is formed between two substrates on which electrodes are formed.

The capping layer 195 is formed to, as a whole, cover the cavity layer 185 forming the cavity CA which houses liquid crystals (LCs), so the capping layer 195 plays a role of encapsulating and protecting a display unit.

In the present embodiment, the capping layer 195 is formed of a material formed by diffusing a plurality of fillers Fs to a liquid sealant. In the following, such a material is referred to as polymer-filler nano-composite (PFN).

PFN is used as a material for forming a capping layer to enhance barrier characteristics, that is, by PFN, coefficient of thermal expansion may decrease, modulus may increase, and static electricity may decrease.

When filler particles form a matrix in a polymer, the following relation is established among a volume fraction occupied by the fillers, an aspect ratio of the fillers and permeability:

$$\frac{P_{comp}}{P_{poly}} = \frac{1-\phi}{1+a\phi}$$

In this relation, $P_{comp}$ means the permeability of PFN, and $P_{poly}$ means the permeability of a pure polymer that does not contain fillers. Moreover, 'a' indicates an aspect ratio, $\Phi$ indicates a volume fraction occupied by fillers in a polymer, and it is assumed that the fillers are homogeneously diffused in the polymer.

Referring to FIG. 2 indicating the relation by a graph, it may be seen that barrier characteristics may be enhanced even if a significantly small amount of fillers are contained. For example, in the case of PFN in which fillers occupying about 1% are contained, permeability drastically decreases in comparison to a polymer in which fillers are not contained. Such a tendency is more remarkable as the aspect ratio of the fillers increases.

The permeability of PFN is also affected by the alignment of the fillers in the polymer, and has the following relation.

$$\frac{P_{comp}}{P_{poly}} = \frac{1-\phi}{1+a\phi\frac{2}{3}\left(S+\frac{1}{2}\right)}$$

In this relation, S is defined as follows.

$$S=\tfrac{1}{2}<3\cos^2\theta-1>$$

Here, θ indicates filler's orientation in the polymer, and is an angle between fillers and a reference surface. When the fillers are arranged in parallel to the reference surface, θ is 0 and a value of S is 1; when the fillers are arranged perpendicularly to the reference surface, θ is 90° and S is −½; and when the fillers are randomly arranged, S is 0.

Referring to FIG. 3 indicating the relation by a graph, as the aspect ratio of the fillers becomes larger, an effect due to the directional nature of the fillers decreases.

In an embodiment, the sealant of PFN to be used as the material of the capping layer 195, a filler shape, a volume fraction, and a filler material are determined in consideration of both the above-described results and the translucency of the capping layer 195.

As a sealant, various polymers typically used as a sealing material may be used such as an acryl based or epoxy based polymer, such as an acryl based or epoxy based polymer including a photo initiator. Viscosity may be 30 CP to 10000 CP.

The filler F may include a nanoparticle, a nano wire or a nanorod, which are nano-sized, and the material of the filler F may include Ta, Nb, Zr, Th, Ti, Al, Mg, Ba, or P. As the material of the filler F, a getter material that may absorb a gas, e.g., $O_2$ may be used. The aspect ratio of the filler F may be 50 or more. The aspect ratio of the filler F may be 300 or more.

The volume fraction of the fillers contained in the sealant may be 0.5% or more. The volume fraction of the fillers may be 1% or more. Since the transparency of the capping layer becomes worse as the volume fraction of the fillers becomes larger, the volume fraction may be set to 5% or less.

In the following, the exemplary, more detailed structure of the display apparatus 100 is discussed.

The display apparatus 100 includes the substrate 110, the cavity layer 185 formed on the substrate 110 and forming the cavity CA, and the capping layer 195 covering the cavity layer 185.

The cavity layer 185 includes the plurality of barriers PA formed to be spaced apart from one another on the substrate 110, and the roof layer RO connecting the upper parts of the plurality of barriers PA; and forms the plurality of cavities CA on the substrate 110. Regions of the substrate 110 are divided into pixel regions and non-pixel regions formed between the pixel regions, and the pixel regions are partitioned by the barriers PA. That is, the cavity CA is provided to face the pixel region and the barrier PA is provided to face the non-pixel region.

A color filter 120 is arranged on the pixel region and a black matrix 125 is arranged on the non-pixel region. More particularly, a thin film transistor TR and a first passivation layer 115 protecting the thin film transistor TR are formed on the substrate 110, the color filter 120 and the black matrix 125 are formed on the first passivation layer 115, and a second passivation layer 130 is formed on the color filter 120 and the black matrix 125. However, the locations of the color filter 120 and the black matrix 125 are not limited to those shown and may be formed at an upper side of a liquid crystal layer.

As the substrate 110, a glass substrate and a transparent plastic substrate may be used.

The thin film transistor TR includes a gate electrode GE, a gate insulating layer GI, a semiconductor channel layer SC, a source electrode SE and a drain electrode DE, and the drain electrode DE is connected to a pixel electrode 140 through a contact hole that passes through the color filter 120, the first passivation layer 115, and the second passivation layer 130.

A data line and a scan line that cross each other are formed on a region of the substrate 110 that is not shown. The source electrode SE is connected to the data line, and the drain electrode DE is connected to the scan line. A gate line connected to the gate electrode GE is formed, and an electrical signal for forming a conductive path on the semiconductor channel layer SC is applied to the gate electrode GE.

Only one thin film transistor TR is exemplarily shown in the drawings, and a charging capacitor for forming a circuit driving a display unit and one or more thin film transistors may be formed on the substrate 110.

The cavity layer 185 forming the cavity CA is formed on the substrate 110. The pixel electrode 140 is arranged in the cavity CA, and liquid crystals LCs are also injected thereinto. A first alignment layer 170 and a second alignment layer 171 for the alignment of the liquid crystals LCs are arranged over and under the cavity CA, and may be formed to be connected along the inner wall of the cavity CA as shown. The first and the second alignment layers 170 and 171 may be formed of polyimide.

A common electrode 175 is formed on the second alignment layer 171, and a third passivation layer 180 is formed on the common electrode 175.

The cavity layer 185 forming the cavity CA may be formed of as an organic layer. The cavity layer 185 may be formed of a polymer. For example, the cavity layer 185 may be formed of polyethyleneterephthalate, polyimide, polycarbonate, epoxy, polyethylene, and polyacrylate, and more particularly, a polymerized monomer composition including a diacrylate-based monomer and a triacrylate-based monomer. The monomer composition may further include a monoacrylate-based monomer and a known photo initiator such as TPO but the present embodiment is not limited thereto.

A pattern mask layer 190 is formed on the cavity layer 185. The pattern mask layer 190 may be formed of a material including any one of $SiN_x$, $Al_2O_3$, $SiO_2$, $TiO_2$. The pattern mask layer 190 is configured to have a pattern such that a certain region of the cavity layer 185 is exposed to a light and is deformed for forming an opening through which liquid crystals LCs are injected into the cavity CA. The opening is again sealed after the liquid crystals LCs are injected into the cavity CA.

A liquid crystal layer may be formed in a VA mode. That is, while an electric field is not formed, the long axis of the liquid crystals LC is arranged perpendicularly to the surface of the substrate 110.

The pixel electrode 140 may include a plurality of branch electrodes 141. The pixel electrode 140 may include a stem electrode (not shown) that connects the plurality of branch electrodes 141.

In an embodiment, PFN may also be applied to a material that forms the cavity layer 185. However, in this case, when electric field/non-electric field light exposure for the pre-tilt of the liquid crystals LC is performed, a lot of time may be needed or a filler permeates the cavity CA and may affect the switching performance of the liquid crystals LC. Thus, by applying PFN only to the capping layer 195 formed on the cavity layer 185, it is possible to effectively enhance barrier performance while little affecting the pre-tilt process of the liquid crystals LC or excluding a possibility of the filler permeating the cavity CA.

The above-described display apparatus 100 uses the liquid crystal layer as the display material layer as an example but the display apparatus 100 of the present embodiment is not limited thereto. For example, the display apparatus 100 may be an organic light-emitting display apparatus that includes an organic emission layer as the display material layer.

FIGS. 4A to 7D are diagrams for explaining a method of manufacturing a display apparatus according to an embodiment.

The method of manufacturing the display apparatus includes defining pixel regions and non-pixel regions between the pixel regions on a substrate, forming a roof layer so that a cavity is formed to face the pixel regions, forming a display material layer on the pixel regions, and forming a capping layer that is formed of a material formed by diffusing a plurality of fillers to a sealant so that the roof layer is covered.

In the following, a method of manufacturing an embedded microcavity device (EMD) type LCD is described as an example but the present embodiment is not limited thereto.

Figure 4A:
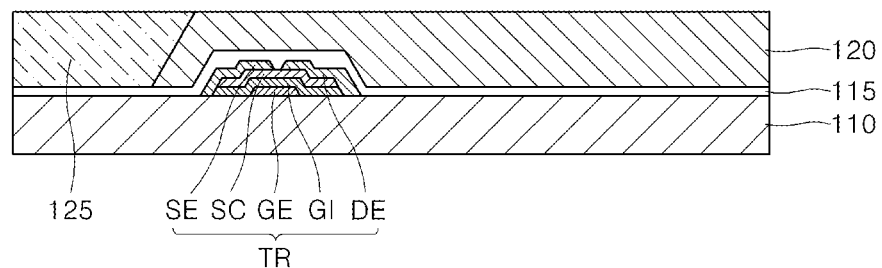
FIGS. 4A, 4B, 4C, 5A, 5B, 5C, 5D, 6A, 6B, 6C, 7A, 7B, 7C, 7D are diagrams for explaining a method of manufacturing a display apparatus according to an embodiment.
Figure 4B:
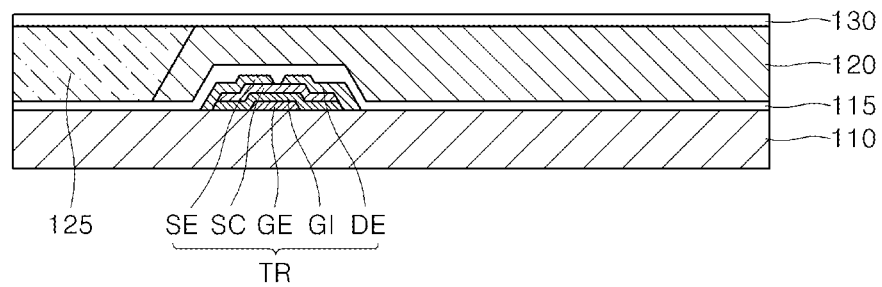
Figure 4C:
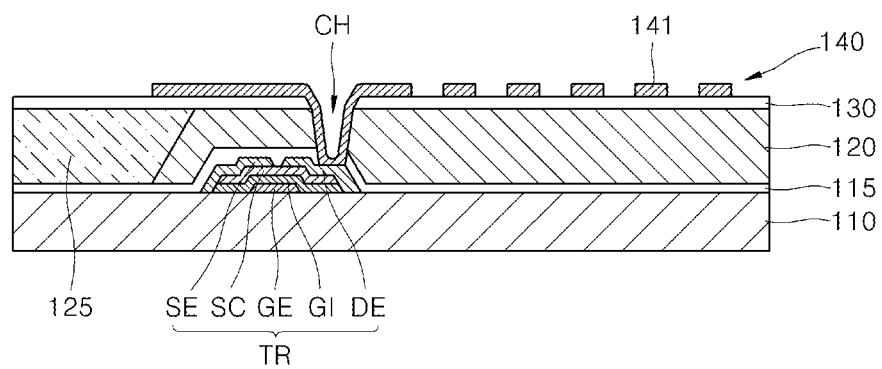

FIGS. 4A to 4C show forming a wiring structure such as a thin film transistor TR and a pixel electrode on a substrate on which a cavity is to be formed.

Referring first to FIG. 4A, the thin film transistor TR and the first passivation layer 115 protecting the thin film transistor TR are formed on the substrate 110, and the black matrix 125 and the color filter 120 are formed on the first passivation layer 115.

The substrate 110 may be a glass substrate and a transparent plastic substrate.

The thin film transistor TR includes the gate electrode GE, the gate insulating layer GI, the semiconductor channel layer SC, the source electrode SE, and the drain electrode DE. In addition to one thin film transistor shown, one or more other thin film transistors and a charging capacitor are formed on the substrate 110, and a gate line connected to the gate electrode GE, a data line connected to the source electrode SE, and a scan line connected to the drain electrode DE are formed on the substrate 110. The first passivation layer 115 may be formed of an insulating material, such as a material including at least one of $SiN_x$, $Al_2O_3$, $SiO_2$, $TiO_2$.

Next, as shown in FIG. 4B, the second passivation layer 130 is formed. The second passivation layer 130 may be formed of an insulating material, such as a material including any one of $SiN_x$, $Al_2O_3$, $SiO_2$, $TiO_2$.

Next, as shown in FIG. 4C, a contact hole CH passing through the first passivation layer 115, the color filter 120, and the second passivation layer 130 is formed and the pixel electrode 140 is formed to be connected to the drain electrode DE. The pixel electrode 140 may include a plurality of branch electrodes 141 and a stem electrode that connects the branch electrodes 141 is further formed on a region not shown in FIG. 4C. The pixel electrode 140 may be formed of a transparent conductive material such as ITO or IZO.

FIGS. 5A to 5D show forming a sacrificial layer and a cavity layer in order to form a cavity corresponding to a pixel region.

Figure 5A:
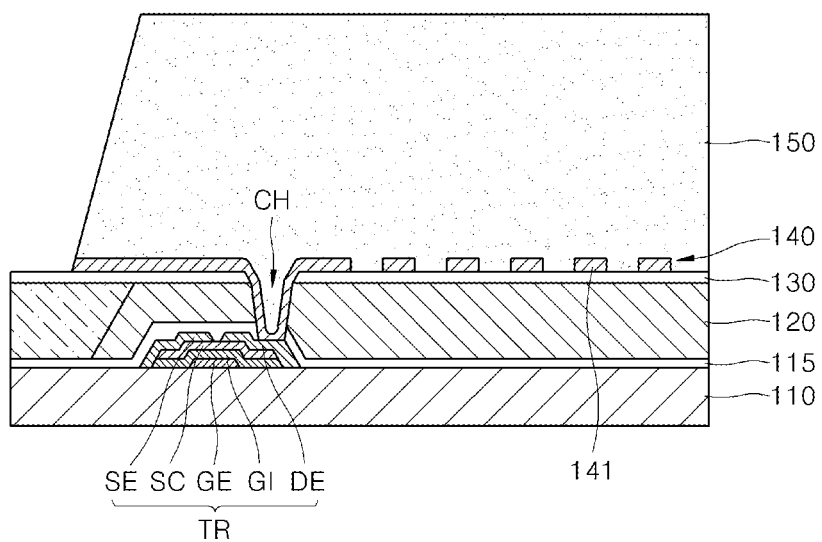
Figure 5B:
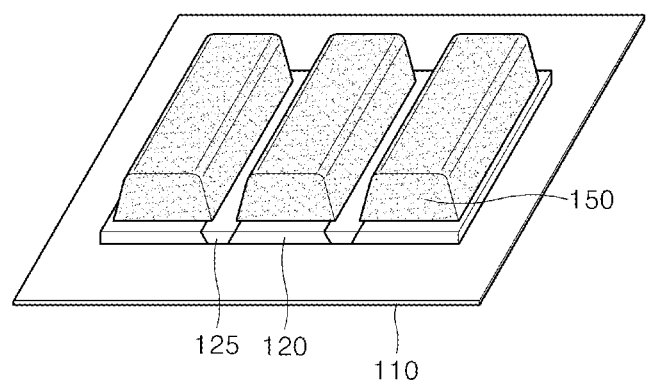

Referring to FIGS. 5A and 5B, a sacrificial layer 150 is formed on the substrate 110. The sacrificial layer 150 is a region to become a cavity corresponding to a pixel region through removal later and may be formed to face the color filter 120 formed on the substrate 110. The sacrificial layer 150 may be formed of a photoresist material and may be formed according to a general photolithography process. That is, after forming a photoresist layer on the entire region of the substrate 110, light exposure and pattering are performed to have a shape corresponding to a cavity to be formed, e.g., a pattern as shown in FIG. 5B.

Figure 5C:
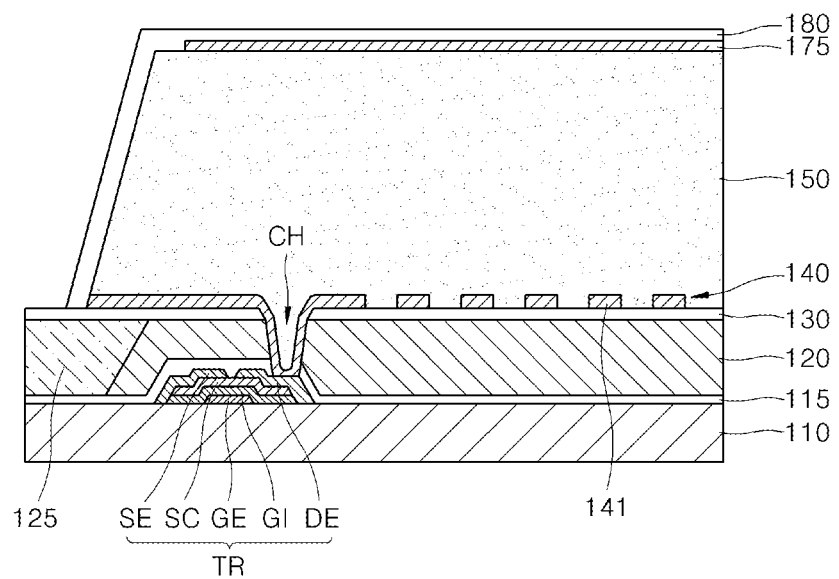

Next, the common electrode 175 is formed on the sacrificial layer 150 and the third passivation layer 180 is formed on the common electrode 175, as shown in FIG. 5C. The common electrode 175 may be formed of a transparent conductive material such as ITO or IZO and the third passivation layer 180 may be formed of an insulating material such as SiNx, Al2O3, SiO2, or TiO2.

Figure 5D:
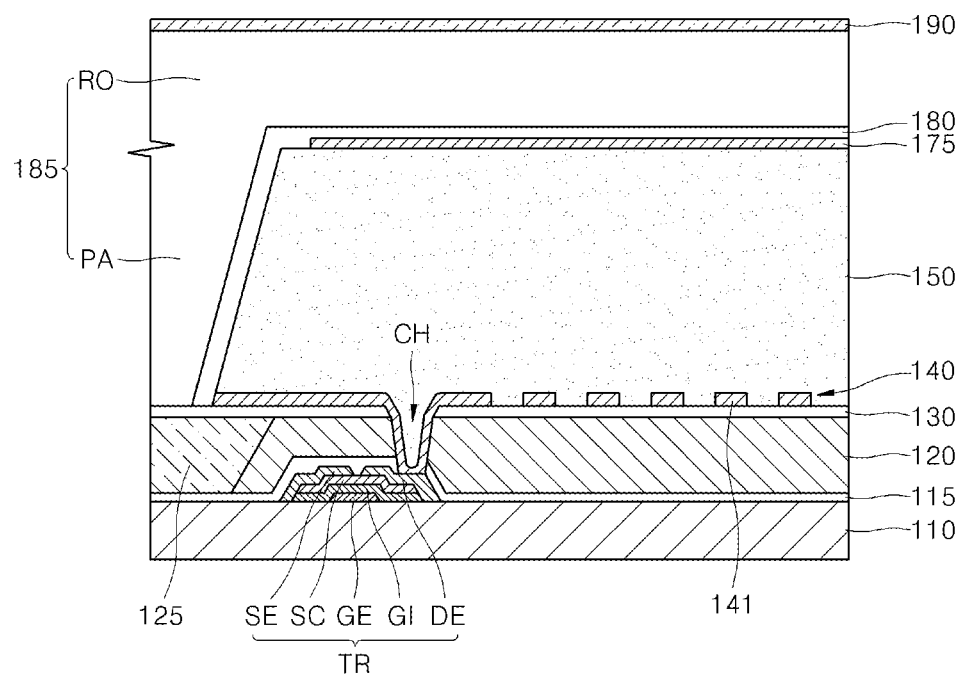

Next, the cavity layer 185 is formed as shown in FIG. 5D. The cavity layer 185 has a shape covering both the sides and top of the sacrificial layer 150 patterned as shown in FIG. 5B and is formed to include barriers PA partitioning pixel regions and a roof layer RO connecting the barriers PA. After the sacrificial layer 150 is removed, a cavity will be formed in a region where the sacrificial layer 150 has been located. The cavity layer 185 may be formed of a polymer such as polyethyleneterephthalate, polyimide, polycarbonate, epoxy, polyethylene, and polyacrylate.

A thickness of the cavity layer 185 over the sacrificial layer 150, i.e., a thickness of the roof layer RO may be 50 um or less. In the present embodiment, since a capping layer having enhanced barrier performance is formed by introducing PFN onto the cavity layer 185, there is no need for the roof layer RO to have a thickness thicker than 50 um. When the roof layer RO is excessively thick, there is a limitation in that light exposure energy or a time may be excessively needed in the following electric field/non-electric field light exposure process.

After forming the cavity layer 185, the pattern mask layer 190 is formed on the cavity layer 185. The pattern mask layer 190 may be formed of SiNx and may be patterned to have a shape for deforming a certain region of the cavity layer 185 and exposing a portion of the sacrificial layer 150.

Figure 6A:
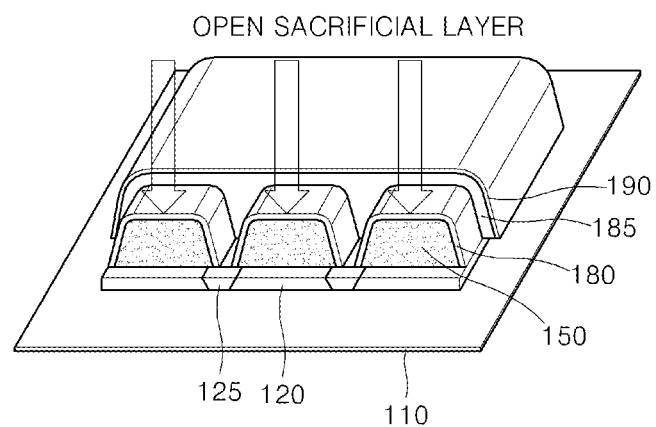
Figure 6B:
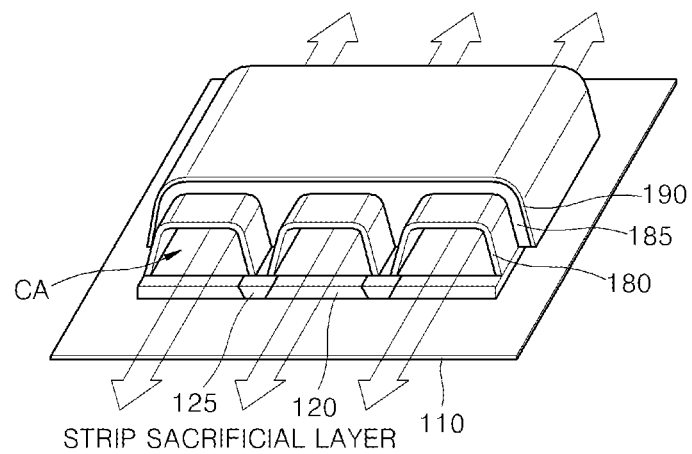
Figure 6C:
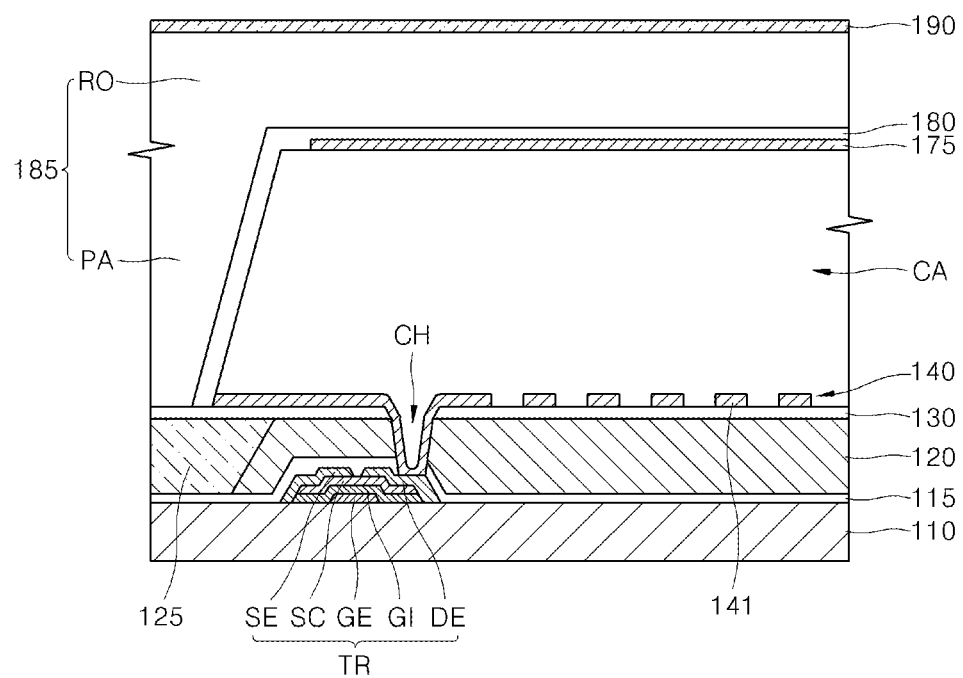

FIGS. 6A to 6C show removing the sacrificial layer 150 and forming the cavity CA.

By removing a certain region of the cavity layer 185 by using the pattern mask layer 190, a portion of the third passivation layer 180 and a portion of the sacrificial layer 150 are exposed as shown in FIG. 6A.

Next, by removing the sacrificial layer 150 as shown in FIG. 6B, the cavity CA is formed where the sacrificial layer 150 had been located, as shown in FIG. 5C. In order to remove the sacrificial layer, a wet strip process may be used, and in order to remove a residual material, an oxygen plasma process may be further performed.

FIGS. 7A to 7D show injecting the liquid crystals LC into the cavity CA, aligning the liquid crystals LC in a certain direction, and sealing the cavity CA.

Figure 7A:
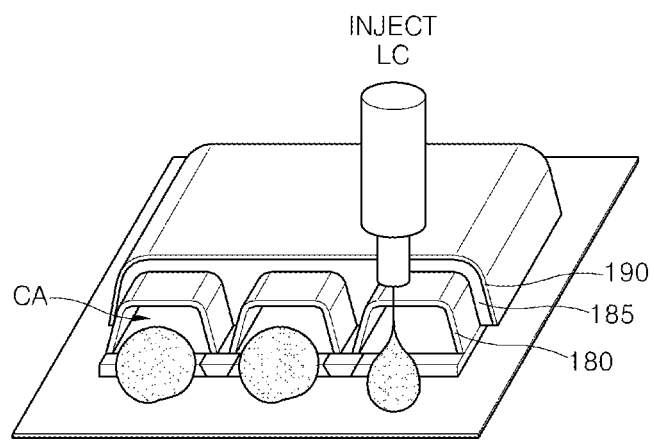
Figure 7B:
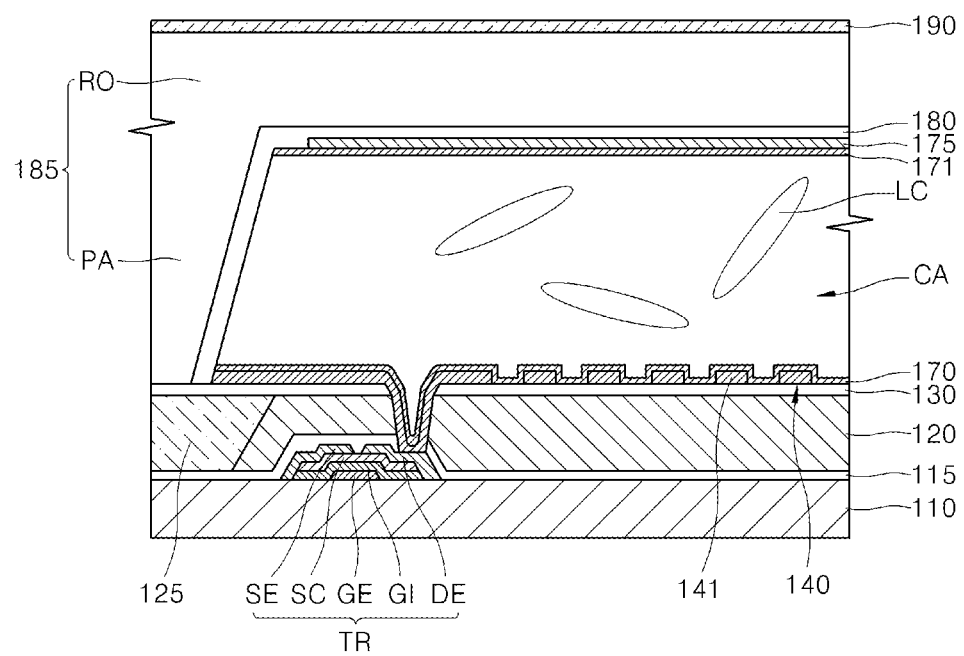

As shown in FIG. 7A, the liquid crystals LC is injected into the cavity CA. An inkjet nozzle may be used to inject the liquid crystals LC, and before injecting the liquid crystals LC into the cavity CA, the first alignment layer 170 and the second alignment layer 171 may be formed on inside surface of the cavity CA as shown in FIG. 7B. The first and the second alignment layers 170 and 171 may be formed of polyimide and a thermalsetting process may be performed. Although the first and the second alignment layers 170 and 171 are shown to be separated from each other, they may be formed to be connected to each other along the inner wall of the cavity CA depending on the manufacturing process.

After the liquid crystals LC are injected, the open region of the cavity layer 185 as shown in FIG. 6B is filled with the same or similar material as the cavity layer 185.

Figure 7C:
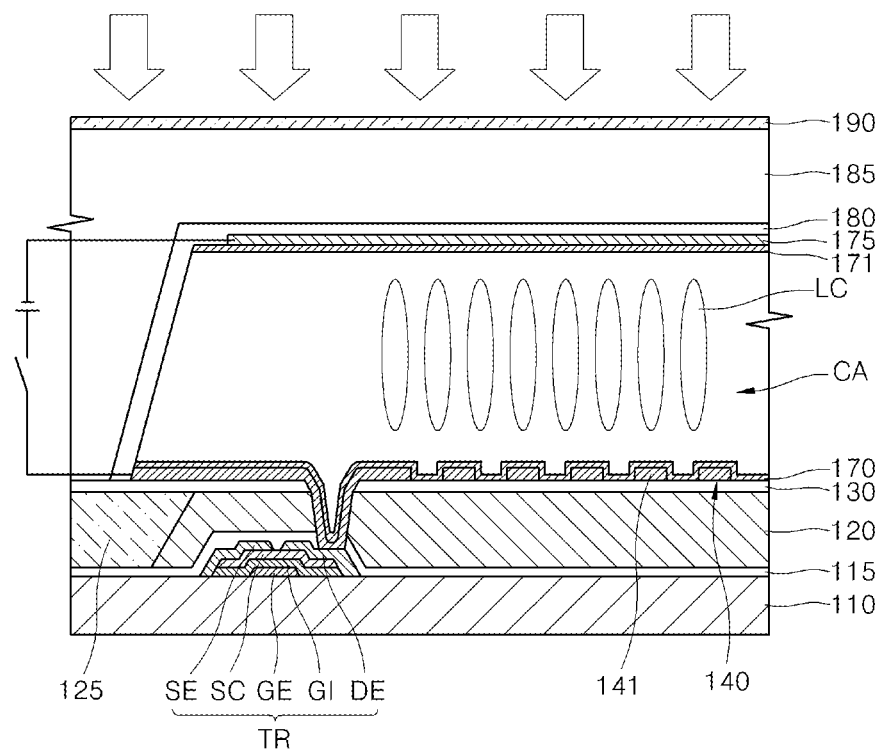

Next, as shown in FIG. 7C, electric field light exposure and non-electric field light exposure processes are performed.

The electric field light exposure means radiating a light while forming an electric field on the liquid crystal and the non-electric field light exposure means radiating a light without forming the electric field on the liquid crystal layer.

The electric field light exposure is performed to form the pre-tilt of the liquid crystals LCs. In performing the electric field light exposure, if a voltage is applied to between the pixel electrode 140 and the common electrode 175 and an electric field is formed on the liquid crystal layer, the liquid crystals LCs are arranged in a certain direction. Adjacent liquid crystals LCs are arranged in parallel to the length direction of the plurality of branch electrodes 141 forming the pixel electrode 140 and their long axes are arranged at an angle. Although the long axes of the liquid crystals LCs are shown to be arranged perpendicularly to the substrate 110, it is an example and a tilt angle is formed. By the light exposure, the LC compound containing the liquid crystals LCs is cured, and even after the electric field is removed, the directional nature of the liquid crystals LCs is maintained.

The non-electric field light exposure induces the reaction of the LC compound that has not reacted in performing the electric field light exposure, and forms the more uniform arrangement of the liquid crystals LCs.

The electric field/non-electric field light exposure is performed with light exposure energy and a light exposure time suitable for an LC arrangement, and in the present embodiment, since it is possible to decrease a thickness of the cavity layer 185, the light exposure energy and the light exposure time decrease.

Figure 7D:
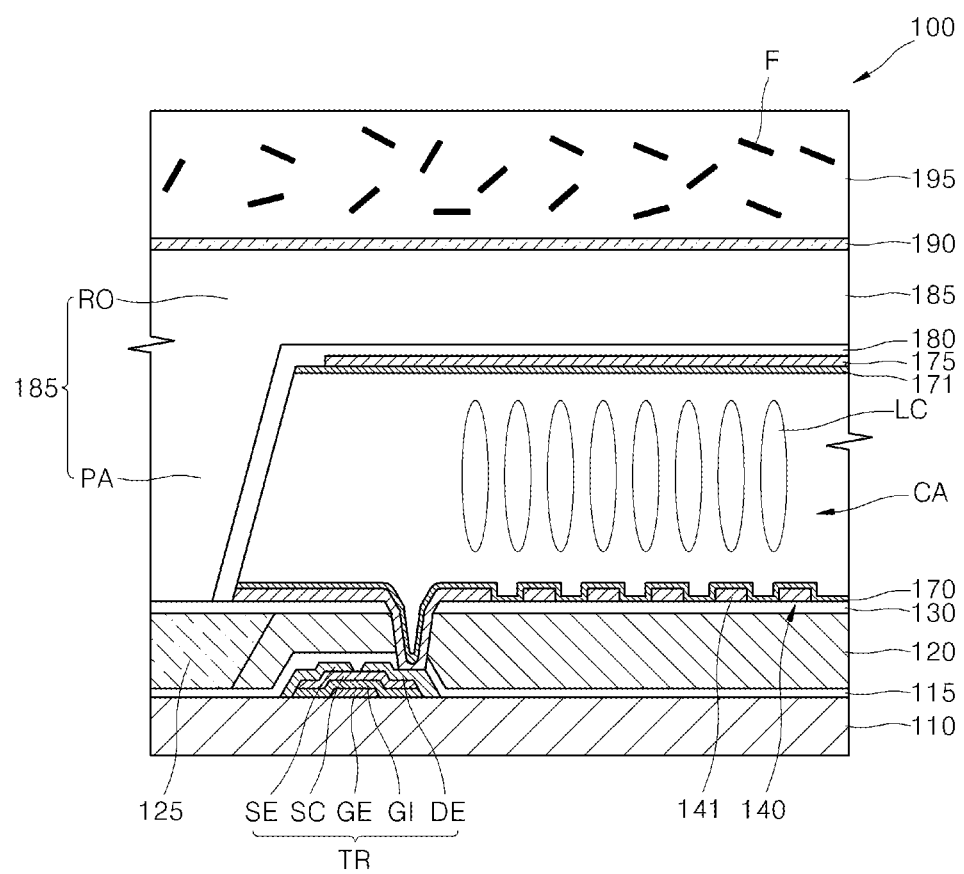

Next, the capping layer 195 is formed as shown in FIG. 7D. Before forming the capping layer 195, a cleaning process may be performed and residual LCs generated in the LC injection process of FIG. 7B may be removed.

The capping layer 195 may be formed of a material, FPN, formed by diffusing a plurality of fillers to a sealant, and may be formed by coating or printing, with the cavity layer 185, the sealant to which the plurality of fillers are diffused. As the sealant, an acryl-based or epoxy-based polymer material may be used. The shape, material and content ratio of the filler may be determined in consideration of the barrier performance and translucency of the capping layer 195. The filler F may include a nano-particle, a nano-wire or a nano-rod as described above, and the material of the filler F may be a material including Ta, Nb, Zr, Th, Ti, Al, Mg, Ba, or P. As the material of the filler F, a getter material that may absorb a gas such as O2 may be used. An aspect ratio of the filler F may be 50 or more. More particularly, the aspect ratio of the filler F may be 300 or more. A volume fraction of fillers contained in the sealant may be set to 0.5% to 5%.

Such a capping layer 195 remarkably decreases in permeability and is enhanced in barrier performance due to a small amount of fillers that does not affect transparency. In addition, since the formation of the capping layer 195 is performed after the electric field/non-electric field light exposure process forming the pre-tilt of the liquid crystals LC, there is no possibility for the fillers F to permeate the cavity CA or to affect the pre-tilt process.

The above-described display apparatus forms the capping layer by using a sealant to which the plurality of fillers are diffused, and thus has enhanced barrier performance.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the inventive concept as defined by the following claims.

What is claimed is:

1. A display apparatus comprising:
    a substrate;
    a cavity layer including a plurality of barriers arranged to be spaced apart from one another on the substrate and partitioning pixel regions, and a roof layer connecting upper parts of the plurality of barriers, the cavity layer forming a plurality of cavities comprising a cavity;
    a display material layer formed in the cavity;
    a pattern mask layer on the cavity layer, the pattern mask layer having a pattern for forming an opening through a certain region of the cavity layer; and
    a capping layer formed on the cavity layer and in direct contact with the pattern mask layer, the capping layer including a sealant and a plurality of fillers dispersed in the sealant.

2. The display apparatus of claim 1, wherein the sealant comprises an acryl-based or epoxy-based polymer material.

3. The display apparatus of claim 2, wherein a viscosity of the sealant is 30 CP to 10000 CP.

4. The display apparatus of claim 2, wherein an aspect ratio of the fillers is 50 or more.

5. The display apparatus of claim 1, wherein the fillers comprises a nanoparticle, a nanowire, or a nanorod, which are nano-sized.

6. The display apparatus of claim 1, wherein a volume fraction of the fillers contained in the sealant is 0.5% to 5%.

7. The display apparatus of claim 1, wherein a material of the fillers comprises Ta, Nb, Zr, Th, Ti, Al, Mg, Ba, P, or a getter material.

8. The display apparatus of claim 1, wherein a common electrode and a pixel electrode that are formed of transparent electrode materials are formed over and under the cavity respectively.

9. The display apparatus of claim 8, wherein between the substrate and the cavity layer, a transistor configured to drive the pixel electrode and a passivation layer passivating the transistor are formed.

10. The display apparatus of claim 9, wherein between the passivation layer and the cavity layer, a black matrix faces the barriers and a color filter faces the cavity.

11. The display apparatus of claim 1, wherein the display material layer comprises a liquid crystal layer or an organic emission layer.

12. A method of manufacturing a display apparatus, the method comprising:
    forming a cavity layer including a plurality of barriers arranged to be spaced apart from one another on a substrate and partitioning pixel regions, and a roof layer connecting upper parts of the plurality of barriers, the cavity layer forming a plurality of cavities;
    forming a display material layer in the plurality of cavities; and
    forming a capping layer on the cavity layer and in direct contact with an exposed region of the cavity layer, the capping layer being formed of a material formed by diffusing a plurality of fillers to a sealant.

13. The method of claim 12, wherein the sealant comprises an acryl-based or epoxy-based polymer material.

14. The method of claim 12, wherein a viscosity of the sealant is 30 CP to 1000 CP.

15. The method of claim 12, wherein the fillers comprises a nanoparticle, nanowire, or nanorod, which is nano-sized.

16. The method of claim 15, wherein an aspect ratio of the fillers is 50 or more.

17. The method of claim 12, wherein a volume fraction of the fillers contained in the sealant is 1% to 5%.

18. The method of claim 12, wherein a material of the fillers comprises Ta, Nb, Zr, Th, Ti, Al, Mg, Ba, or P.

19. The method of claim 12, wherein the forming of the cavity layer comprises:
    forming a sacrificial layer on the substrate, the sacrificial layer having a shape corresponding to the plurality of cavities; and
    forming an organic layer on the sacrificial layer and stripping the sacrificial layer.

20. The method of claim 12, wherein the forming of the display material layer comprises injecting liquid crystals into the plurality of cavities.

* * * * *